United States Patent [19]

Argos, Jr. et al.

[11] Patent Number: 5,438,023

[45] Date of Patent: Aug. 1, 1995

[54] PASSIVATION METHOD AND STRUCTURE FOR A FERROELECTRIC INTEGRATED CIRCUIT USING HARD CERAMIC MATERIALS OR THE LIKE

[75] Inventors: George Argos, Jr.; John D. Spano; Steven D. Traynor, all of Colorado Springs, Colo.

[73] Assignee: Ramtron International Corporation, Colorado Springs, Colo.

[21] Appl. No.: 212,495

[22] Filed: Mar. 11, 1994

[51] Int. Cl.$^6$ .................................. H01L 21/02
[52] U.S. Cl. ........................... 437/235; 437/238; 437/240; 437/919; 437/978
[58] Field of Search ............ 148/DIG. 148; 437/238; 365/145; 257/295; 437/235, 240, 919, 980

[56] References Cited

U.S. PATENT DOCUMENTS

| | | | |
|---|---|---|---|
| 4,040,874 | 8/1977 | Yerman | 437/235 |
| 4,149,302 | 4/1979 | Cook | 29/25.42 |
| 4,675,715 | 6/1987 | Lepselter et al. | 257/915 |
| 4,757,028 | 7/1988 | Kondoh et al. | 437/40 |
| 4,759,823 | 7/1988 | Asselamis et al. | 156/659.1 |
| 4,811,078 | 3/1989 | Tigelaar et al. | 257/915 |
| 4,860,254 | 8/1989 | Pott et al. | 365/145 |
| 5,024,964 | 6/1991 | Rohrer et al. | 437/47 |
| 5,040,046 | 8/1991 | Chhabra et al. | 437/238 |
| 5,043,049 | 8/1991 | Takenaka | 204/192.15 |
| 5,081,559 | 1/1992 | Fazan et al. | 361/313 |
| 5,119,154 | 6/1992 | Gnadinger | 257/298 |
| 5,122,923 | 6/1992 | Matsubara et al. | 361/321 |
| 5,124,014 | 6/1992 | Foo et al. | 437/238 |
| 5,266,355 | 11/1993 | Wernberg et al. | 427/248.1 |

FOREIGN PATENT DOCUMENTS

| | | |
|---|---|---|
| 415751A1 | 3/1991 | European Pat. Off. |
| 59-105364 | 6/1984 | Japan ................ 257/915 |
| 60-100464 | 6/1985 | Japan ................ 257/915 |
| 63-023069 | 7/1988 | Japan ............. H01L 29/78 |
| 1-253257 | 10/1989 | Japan ................ 257/915 |
| 1-265524 | 10/1989 | Japan ................ 257/915 |
| 1-241860 | 12/1989 | Japan ............. H01L 27/04 |
| 2-183566 | 7/1990 | Japan ................ 257/915 |
| 2-184079 | 7/1990 | Japan ................ 257/915 |

Primary Examiner—Olik Chaudhuri
Assistant Examiner—H. Jey Tsai
Attorney, Agent, or Firm—Peter J. Meza

[57] ABSTRACT

A method for passivating an integrated circuit includes the RF sputtering of a hard passivation layer on the surface of the integrated circuit. The hard passivation layer can be a ceramic material such as various doped and undoped titanates, zirconates, niobates, tantalates, stanates, hafnates, and manganates, in either their ferroelectric or non-ferroelectric phases. Other exotic, hard, and usually non-ferroelectric materials not normally found in integrated circuit processing such as carbides may also be used. If the integrated circuit sought to be passivated contains ferroelectric devices, the hard passivation layer can be fabricated out of the same material used in the integrated ferroelectric devices. An optional silicon dioxide insulating layer can be deposited on the surface of the integrated circuit before the hard passivation layer is deposited. The optional silicon dioxide layer is used to prevent any possible contamination of the integrated circuit by the passivation layer. Similarly, an optional sealing layer such as silicon dioxide, silicon nitride, or polymer based materials can be deposited on top of the passivation layer to prevent any possible contamination of the integrated circuit package by the passivation layer. Once the hard passivation layer and any optional layers are formed, these layers are etched to provide access to underlying integrated circuit bonding pads.

11 Claims, 4 Drawing Sheets

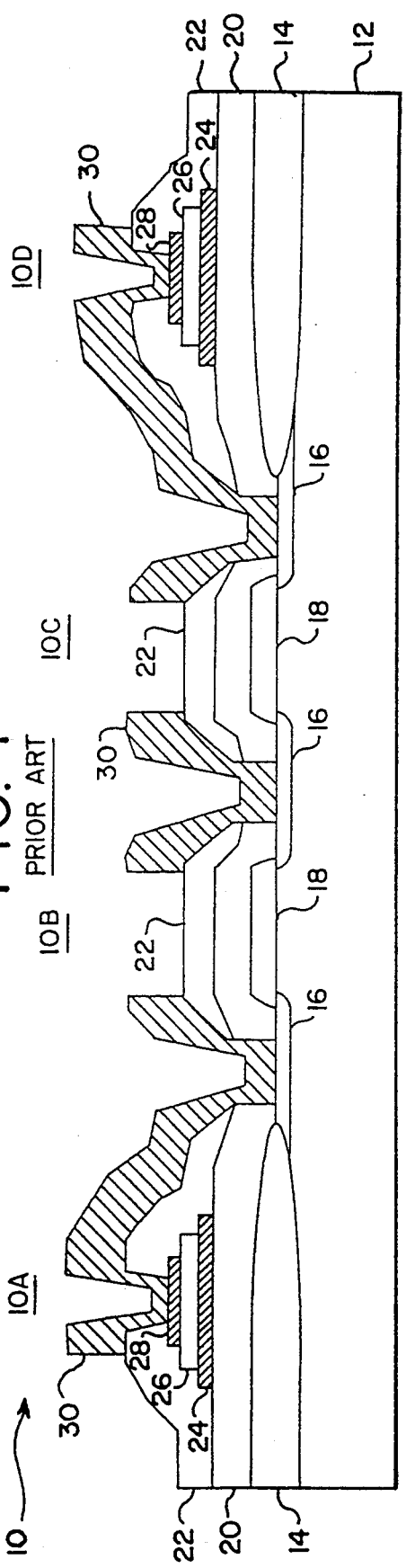
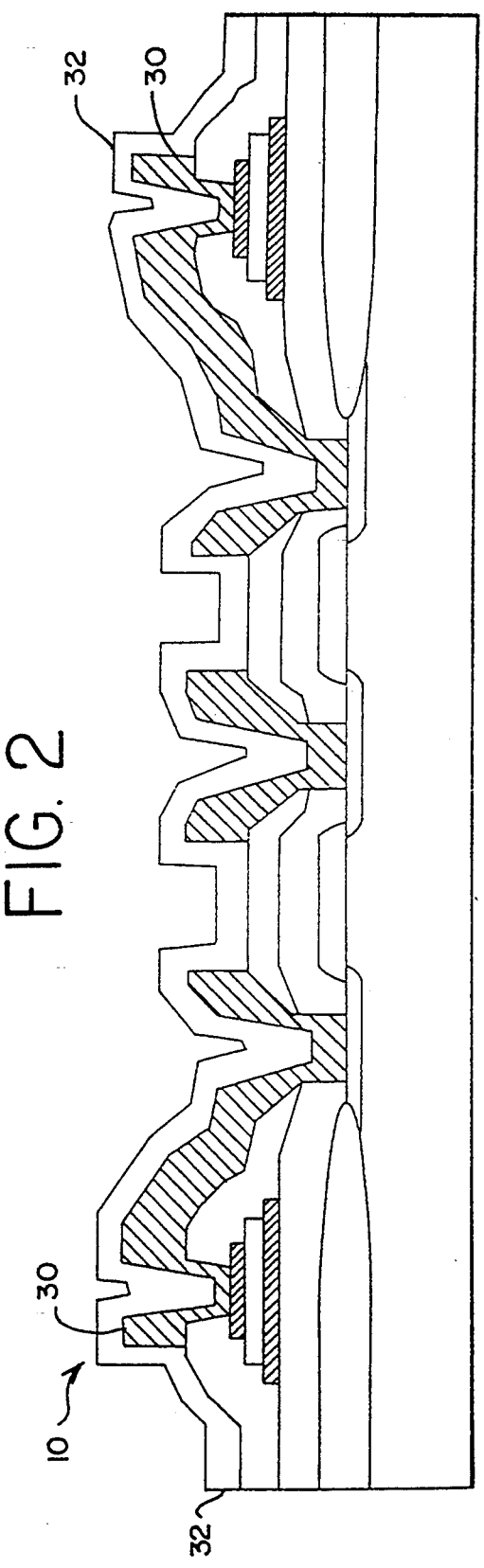

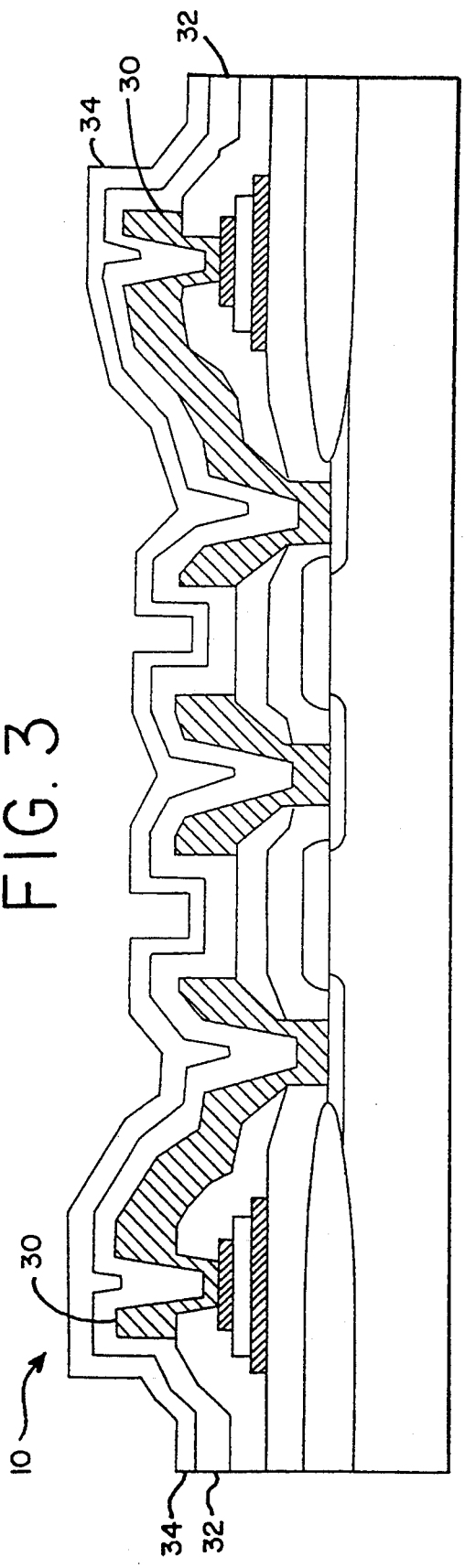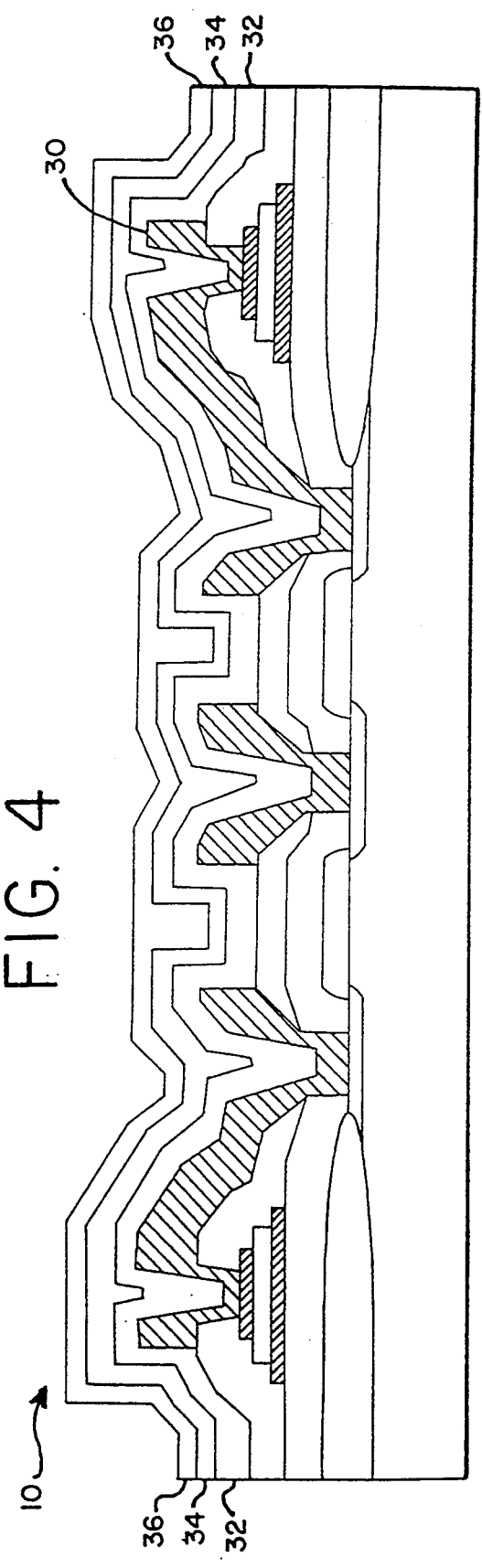

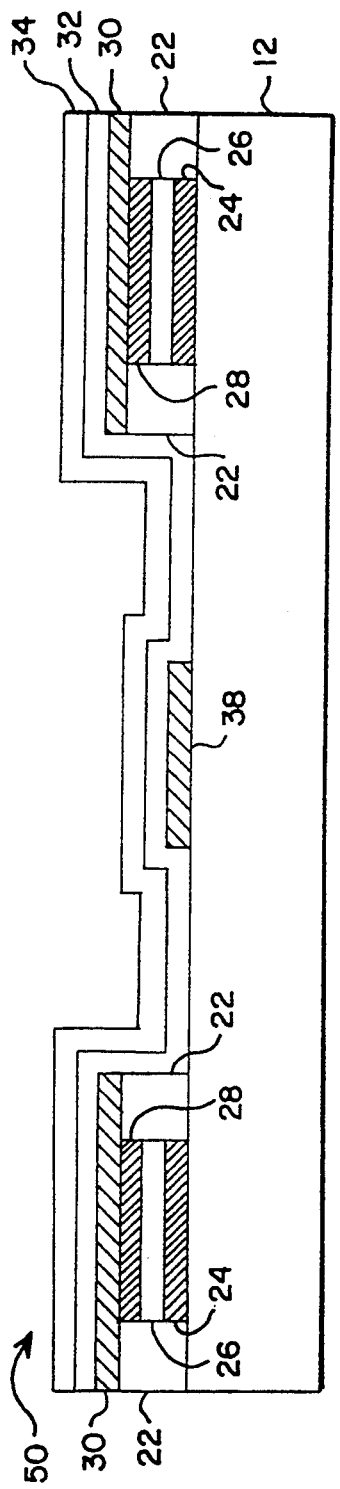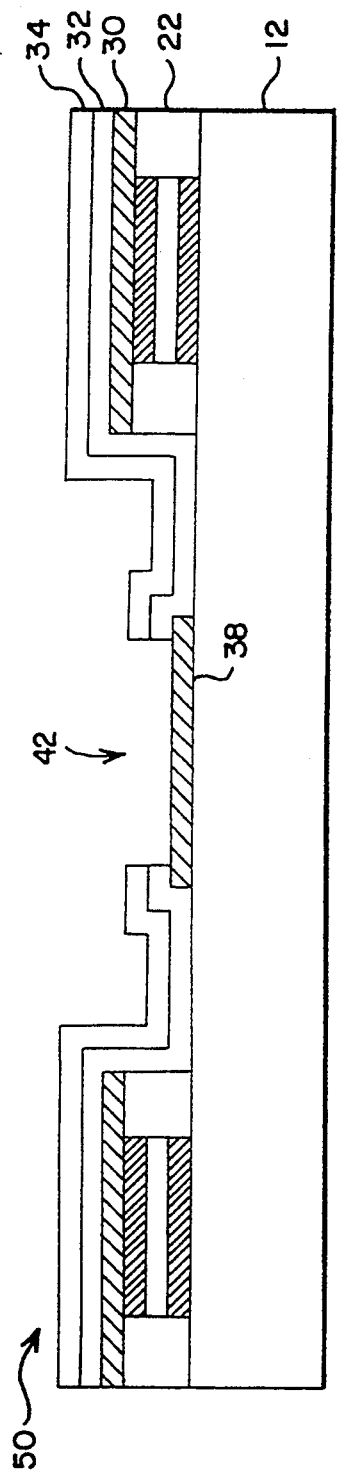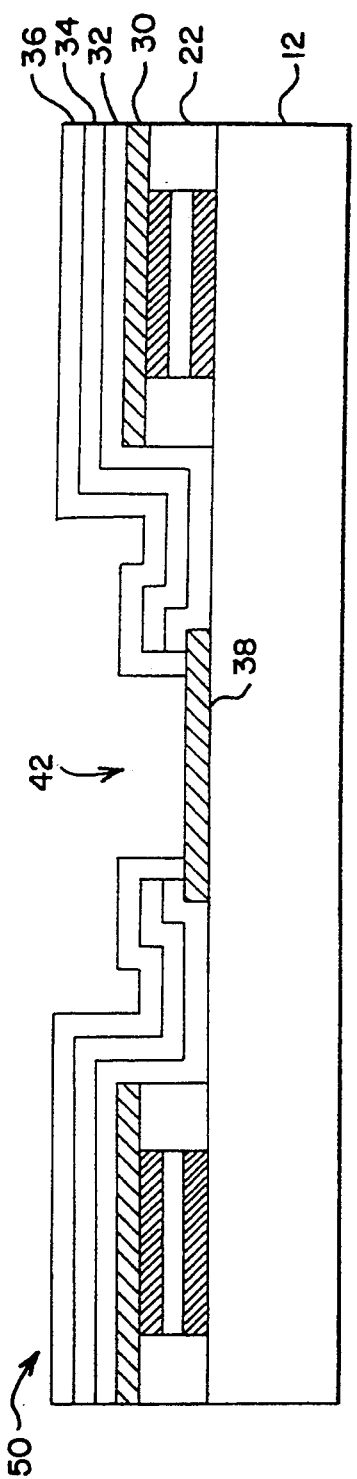

PASSIVATION METHOD AND STRUCTURE FOR A FERROELECTRIC INTEGRATED CIRCUIT USING HARD CERAMIC MATERIALS OR THE LIKE

BACKGROUND OF THE INVENTION

This invention relates generally to passivation of integrated circuits. More particularly, the present invention relates to passivation of integrated circuits containing ferroelectric devices with an extremely hard passivation layer, which can be ceramic as well as ferroelectric.

Typically, silicon dioxide and silicon nitride are used to passivate integrated circuits. These materials are the industry standards for passivating integrated circuits and are used effectively on many types of integrated circuits. A thick layer of chemical vapor deposited ("CVD") silicon nitride, while a preferred passivation material for most integrated circuits, cannot be used on integrated circuits that contain ferroelectric materials. The reason for this is that the conventional technique for CVD depositing silicon nitride includes the presence of hydrogen gas. Ferroelectric materials tend to degrade by losing their ferroelectric properties in the presence of hydrogen. For example, the performance of capacitors fabricated with a common ferroelectric material, lead zirconate titanate ("PZT"), is degraded in the presence of hydrogen. The integrated circuit package itself can also be a source of the undesirable hydrogen gas. It is possible to sputter silicon nitride as a passivation layer, but with the present state of the art, the quality of the resulting passivation layer in not equal to that of the CVD silicon nitride passivation layer. Thus, silicon dioxide is used as an alternative passivation material for ferroelectric integrated circuits. While silicon dioxide passivation can be used in many applications, it is not an ideal passivation material. Silicon dioxide does not provide a good barrier to hydrogen, or a barrier to mobile ion contamination from potassium, sodium, and other mobile ions. In addition, silicon dioxide does not substantially reduce mechanical stress applied to an integrated circuit during packaging, which can also degrade performance.

What is desired is an ideal passivating material for a ferroelectric integrated circuit that prevents hydrogen gas and mobile ion contamination and also has the structural integrity to substantially reduce stress during packaging.

SUMMARY OF THE INVENTION

It is, therefore, a principal object of the present invention to provide an ideal passivation layer for an integrated circuit containing ferroelectric devices or other devices that are degraded in the presence of hydrogen gas.

It is another object of the invention to provide a passivation layer using material layers that already exist in the integrated circuit, namely ferroelectric materials used in integrated ferroelectric devices.

It is an advantage of the invention that the passivation layer acts as a barrier layer to prevent damage to ferroelectric devices on the integrated circuit by blocking hydrogen gas, mobile ions such as sodium, moisture, and other contaminants.

It is another advantage of the invention that the deposition of the passivation layer does not require hydrogen-containing gases, which degrades the performance of ferroelectric devices on the integrated circuit.

It is another advantage of the invention that the hardness and structural sturdiness of the passivation layer substantially reduced stress in subsequent packaging of the passivated integrated circuit.

It is another advantage of the invention that the passivation layer provides scratch protection to the surface of the integrated circuit.

It is another advantage of the invention that the passivation layer provides electro-static discharge ("ESD") protection to the integrated circuit.

According to the present invention, a method for passivating an integrated circuit includes the RF sputtering of a hard passivation layer on the surface of the integrated circuit. The hard passivation layer can be a ceramic material such as various doped and undoped titanates, zirconates, niobates, tantalates, stanates, hafnates, and manganates, in either their ferroelectric or non-ferroelectric phases. Other hard non-ferroelectric materials not normally found in integrated circuit processing, such as carbides, may also be used. If the integrated circuit sought to be passivated contains ferroelectric devices, the hard passivation layer can be fabricated out of the same material used in the integrated ferroelectric devices. An optional silicon dioxide insulating layer can be deposited on the surface of the integrated circuit before the hard passivation layer is deposited. The optional silicon dioxide layer is used to prevent any possible contamination of the integrated circuit by the passivation layer. Similarly, an optional sealing layer such as silicon dioxide, silicon nitride, or polymer based materials can be deposited on top of the passivation layer to prevent any possible contamination of the integrated circuit package by the passivation layer. Once the hard passivation layer and any optional layers are formed, these layers are etched to provide access to underlying integrated circuit bonding pads.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1 is a cross-sectional view of a prior art unpassivated ferroelectric memory cell;

FIG. 2 is a cross-sectional view of the ferroelectric memory cell of FIG. 1 including an optional silicon dioxide insulating layer according to the present invention;

FIG. 3 is the cross-sectional view of FIG. 2 further including a hard passivating layer according to the present invention;

FIG. 4 is a cross-sectional view of FIG. 3 further including an optional sealing layer according to the present invention;

FIG. 7 is a simplified cross-sectional view of an integrated circuit containing ferroelectric devices and a bonding pad, passivated with an insulating layer and a conductive hard passivating layer according to the present invention;

FIG. 8 is a simplified cross-sectional view of FIG. 7 showing the two passivation layers etched back directly above and beyond the width of the bonding pad; and FIG. 9 is a simplified cross-sectional view of FIG. 8 further showing the sealing layer etched directly above the bonding pad in a manner that seals the first two passivation layers and electrically isolates the conductive hard passivating layer from any contact with the bonding pad or bonding wires.

DETAILED DESCRIPTION

Figure 5:
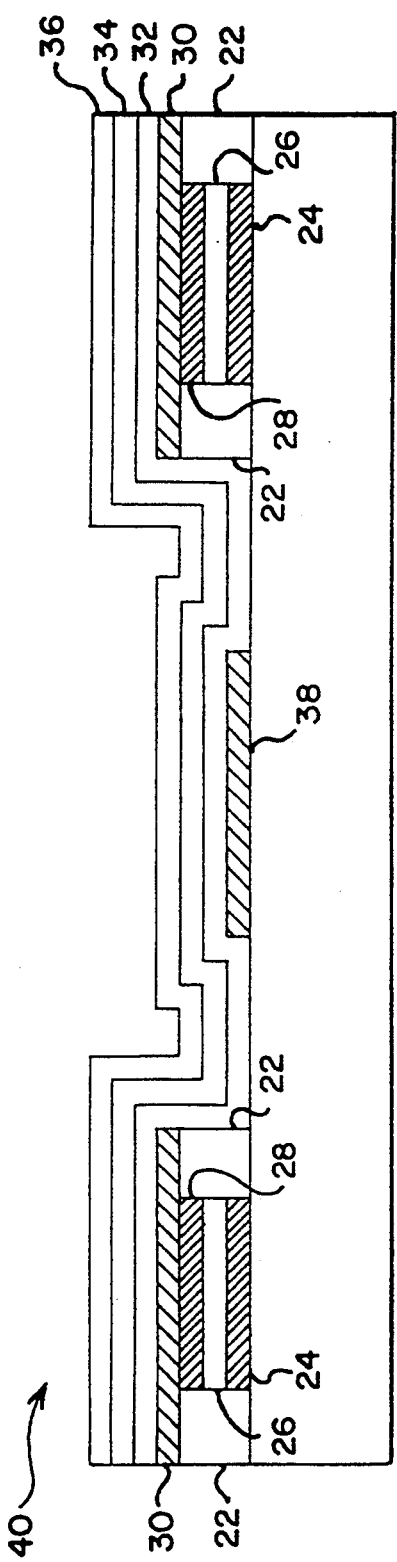
FIG. 5 is a simplified cross-sectional view of an integrated circuit containing ferroelectric devices and a bonding pad, passivated with an insulating layer, an insulative hard passivating layer, and a sealing layer according to the present invention.

Referring now to FIG. 1, an integrated ferroelectric memory cell 10 includes ferroelectric capacitors 10A and 10D, as well as field-effect transistors ("FETs") 10B and 10C. More specifically, ferroelectric memory cell 10 is actually two one-transistor, one-capacitor ("1T-1C") memory cells sharing a common bit line contact. Memory cell 10 includes a substrate or epitaxial layer 12, a thick field oxide layer 14 for isolating transistors associated with one pair of memory cells from the next, diffused areas 16 for forming the drain and source regions of transistors 10B and 10C, gate electrodes 18 that are each coupled to or form portions of a word line (not shown), and isolation layers 20 and 22. Capacitors 10A and 10D are formed with a bottom electrode 24, typically fabricated of platinum and connected to a common "plate line" that is in turn coupled to a plurality of memory cells. Capacitors 10A and 10D also include a ferroelectric dielectric layer 26 and a top electrode 28, also usually fabricated of platinum. The top electrodes 28 of the capacitors are coupled to respective source regions of transistors 10B and 10C via a metalization layer 30. Metalization layer 30 also contacts the common drain of transistors 10B and 10C, forming a common bit line contact. Memory cell 10 as shown in FIG. 1 is completely fabricated in an integrated circuit except for passivation layers. Memory cell 10 is shown only as an example of a typical ferroelectric integrated circuit that can be passivated according to the present invention, and therefore not all barrier and adhesion layers typically found in ferroelectric-related metalization schemes are shown. In fact, any other ferroelectric or even non-ferroelectric integrated circuit can also be passivated according to the present invention.

Referring now to FIG. 2, according to one optional aspect of the present invention, an insulating layer 32 of silicon dioxide ($SiO_2$) is subsequently deposited over the entire surface of the integrated circuit. The silicon dioxide layer 32 is deposited in a plasma enhanced chemical vapor deposition ("PECVD") system. Preferably, silicon dioxide layer 32 is deposited by the reaction of tetraethylorthosilicate ("TEOS") and oxygen ($O_2$) in a plasma environment at a desired nominal temperature of about 400° C., although a range of 300° to 450° C. may be employed. The reaction can be enhanced by using a plasma generated using a dual frequency power source. A high frequency power source of about 13.56 MHz is applied to an upper electrode of the deposition chamber and a low frequency power source of about 100 KHz to 400 KHz is applied to a lower electrode of the deposition chamber. The level of high frequency power is set within a range of zero to 2000 Watts, but preferably to within about 500 Watts. The level of low frequency power can be independently selected, but is also within a range of zero to 2000 Watts, and nominally set at about 500 Watts. The pressure of the deposition chamber is set within a range of about one to five Torr, preferably to about 2.7 Torr. The silicon dioxide insulating layer 32 is deposited to a thickness within a range of between 500 and 30,000 Angstroms, preferably about 7000 Angstroms. While the preferred method for generating insulating silicon dioxide layer 32 has been set forth in detail, it should be noted that layer 32 is entirely optional, and that other methods may be employed. The primary reason for using layer 32 is that there may be actual or perceived contamination problems between a hard passivation layer 34 to be added later as described below and the rest of the integrated circuit, particularly the active devices in memory cell 10. Another reason for using layer 32 is to insulate a conductive hard ceramic layer 34 as is explained in further detail below.

Referring now to FIG. 3, a passivation layer 34 of a hard material is subsequently sputtered onto the silicon dioxide layer 32, or if layer 32 is omitted, directly onto the surface of the unpassivated integrated circuit. Layer 34 can be formed of a hard ceramic material selected from a group of materials that are usually ferroelectric such as doped and undoped titanates (compounds containing $TiO_3$, such as $PbTiO_3$), zirconates (compounds containing $ZrO_3$, such as $PbZrO_3$), niobates (compounds containing $NbO_3$, such as $LiNbO_3$), tantalates (compounds containing $TaO_3$, such as $LiTaO_3$), stanates (compounds containing $SnO_3$, such as $PbSnO_3$), hafnates (compounds containing $HfO_3$, such as $PbHfO_3$), manganates, PZT ($PbZr_xTi_{1-x}O_3$, where X is around 0.5), and other solid solutions of lead, titanium, zirconium, tin, and hafnium according to the formula $Pb(Ti, Zr, Sn, Hf)O_3$. Appropriate dopant materials are calcium, lanthanum, lead, and strontium, among others. Layer 34 can also be formed of a hard ceramic material selected from a group of materials that are usually not ferroelectric such as borides (compounds containing boron, such as aluminum boride (AlB)), carbides (compounds containing carbon, such as tungsten carbide (CWC)), zirconium carbide (ZrC), and silicon carbide (SIC)), nitrides (compounds containing nitrogen such as titanium nitride (TiN)), and oxides (compounds containing oxygen such as aluminum oxide ($Al_2O_3$)). Layer 34 is used primarily as a passivation layer, contamination barrier, and for its structural integrity. Its ability to retain an electric field (ferroelectricity) is not necessary for the material to be used in these ways. Layer 34, therefore, can also be formed of other hard materials having a Mohs hardness value of seven or greater (or a Knoop Value of 820 or greater), regardless of the material's ferroelectric or conductive properties. Any hard material, even materials not normally associated with integrated circuit processing, that can be deposited by RF or DC sputtering from a target onto the wafer can be used.

Ideally, the material for layer 34 is doped or undoped PZT, the same material that is typically used as the dielectric in ferroelectric capacitors in integrated nonvolatile memory circuits. Thus, the same ferroelectric PZT material would serve two functions on an integrated circuit passivated according to the present invention, namely as a dielectric layer for the ferroelectric capacitors and subsequently as the passivation layer for the entire integrated circuit. It should be noted, however, that the material used in the ferroelectric capacitors and in passivation layer 34 can be different, even if both are ceramic and ferroelectric. If PZT is used, it is deposited to a thickness preferably of about 3000 Angstroms by RF sputter deposition, or within a range of thickness between 500 and 30,000 Angstroms. The sputter deposition chamber pressure is preferably about 3 Torr, or within a pressure range of between 0.2 and 10 Torr. The gas in the chamber is ideally argon, but other suitable gases can be used. The temperature of the wafer pallet is preferably set at about 200° C., or within a temperature range of 23° to 900° C. The power applied to generate the plasma is preferably about 1000 Watts, or within a range of about 50 to 2000 Watts. The specifications associated with the sputtering of layer 34 are only by way of example for PZT, and can be changed to accommodate other types of passivating materials.

Referring now to FIG. 4, according to a further aspect of the invention, a final "sealing" layer 36 can be deposited over the hard passivation layer 34, if it is deemed necessary to prevent any possible contamination of the package by the passivation layer. Sealing layer 36 can be silicon dioxide deposited in the manner described above with reference to silicon dioxide layer 32, or it can even be silicon nitride. Note that now that the passivation layer 34 has been formed, the sealing layer 36 can be PECVD thick silicon nitride. Passivation layer 34 forms an effective barrier for hydrogen, and thus the PECVD process can be used without harm to the underlying ferroelectric layers. Any other passivating material such as a polymer based material may be used for sealing layer 36. As with layer 32, sealing layer 36 is optional and is only used if there are real or perceived contamination problems due to the hard ceramic layer 34. Thus, the thickness and type of material used for layer 36 should be selected to prevent whatever contamination is thought to occur between the hard passivation layer 34 and the package. If no such contamination issue is deemed to exist, sealing layer 36 can be eliminated. Another possible reason for using layer 36 is to seal and electrically isolate a conductive hard ceramic layer 34 as is explained in further detail below.

Figure 6:
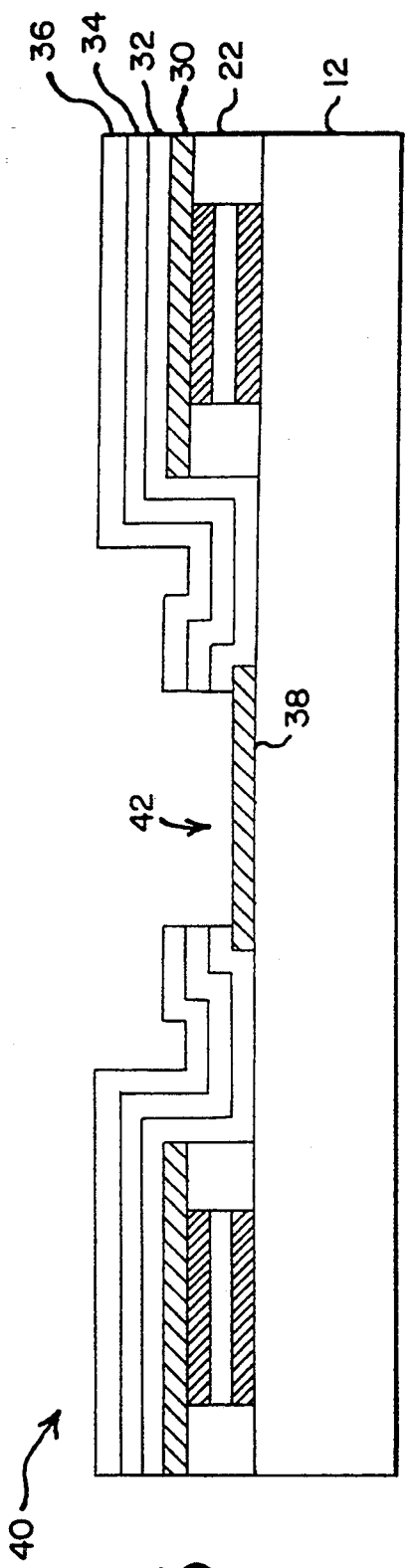
FIG. 6 is a simplified cross-sectional view of FIG. 5 showing the etched passivation layers directly above the bonding pad.

Referring now to FIG. 5, a simplified cross-section of a generic ferroelectric integrated circuit 40 is shown having a three layer passivation scheme according to the present invention. Again, barrier and adhesion layers typically found in ferroelectric-based metalization schemes are omitted for clarity. It is important to note that in FIG. 5 it is assumed that the hard passivation layer 34 is an electrical insulator, i.e. has a very high resistivity. Integrated circuit 40 includes a substrate or epitaxial layer 12 and two ferroelectric capacitors each including electrodes 24 and 26, and a ferroelectric dielectric layer 26. Each ferroelectric capacitor stack is laterally isolated with insulating features 22. A metal wiring layer 30 contacts the upper electrode 28 of each of the ferroelectric capacitors. Also shown on substrate 12 is a metallic bonding pad 38 for electrical connection to the integrated circuit package. Integrated circuit 40 is passivated with an optional silicon dioxide layer 32, a hard insulative passivation layer 34, and an optional sealing layer 36. The three passivation layers completely cover bonding pad 38, and must therefore be removed from this portion of the integrated circuit 40. Turning to FIG. 6, the same generic integrated circuit 40 is shown wherein the passivation has been patterned by standard photolithography techniques and etched to form a via 42 for allowing electrical contact to bonding pad 38. Passivation layers 32, 34, and 36 in combination, or layer 34 individually, can be etched by a chemical wet etching technique, a reactive ion etching technique, or a physical sputter etching technique, or any combination thereof. It should be noted that in FIG. 6, the edges of passivation layer 34 may be contacted by a bonding wire (not shown) placed in via 42 to contact bonding pad 38. Such a contact to the edge of layer 34 should not present any electrical problems since layer 34 is an electrical insulator.

Referring now to FIG. 7, a simplified cross-section of a generic ferroelectric integrated circuit 50 is shown having the first two passivation layers of the passivation scheme according to the present invention. It is important to note that in FIG. 7 it is assumed that the hard passivation layer 34 is an electrical conductor, i.e. has a very low resistivity. Integrated circuit 50 includes the same material layers and features 12, 22, 24, 26, 28, and 30 as in the previously described integrated circuit 40 shown in FIG. 5. Also shown on substrate 12 in FIG. 7 is a metallic bonding pad 38 for electrical connection to the integrated circuit package. Integrated circuit 50 is passivated with silicon dioxide layer 32 and a hard conductive passivation layer 34. Note that for integrated circuit 50, the silicon dioxide layer 32 is not optional, but must be provided to insulate the conductive passivation layer 34 from the surface of integrated circuit 50. Passivation layers 32 and 34 completely cover bonding pad 38, and must therefore be removed from this portion of the integrated circuit 40. Turning to FIG. 8, integrated circuit 50 is shown wherein the passivation has been patterned by standard photolithography techniques and etched to form a via 42 that exposes bonding pad 38. Passivation layers 32 and 34 can be etched by a chemical wet etching technique, a reactive ion etching technique, or a physical sputter etching technique, or any combination thereof. In FIG. 9, the insulating sealing layer 36 is deposited, patterned, and etched. Via 42 is slightly narrowed by sealing layer 36 to allow an overlap and coverage of layers 32 and 34. Sealing layer 36, therefore, in conjunction with layer 32, completely encapsulates the conductive passivation layer 34 so that there can be no electrical contact to a bonding wire placed in via 42. Since the edge of conductive passivation layer 34 is completely insulated, it should not present any electrical shorting problems between bonding pads or bonding wires. A conductive passivation layer 34 is not optimal because it may present capacitive loading problems to conductors such as metal layer 30. If circuit speeds are low, however, the capacitive loading effects may be minimal, and a hard passivation material that is conductive may be selected for layer 34.

A novel passivation scheme for an integrated circuit has been shown. An advantage of using hard ceramic or other such materials for a passivation layer is that the passivation layer provides scratch protection to the surface of the integrated circuit. Another advantage of the hard ceramic materials used is that the passivation layer provides ESD protection to the integrated circuit.

Having described and illustrated the principles of the invention with reference to a preferred embodiment thereof, it should be appreciated by those having skill in the art that the invention can be modified in arrangement and detail without departing from such principles. For example, there are innumerable candidates for the passivation layer within the teachings of the present invention, such as ceramic, ferroelectric, or other hard materials. The material used in the passivation layer may or may not be the same material as used in ferroelectric devices on the passivated integrated circuit. We therefore claim all modifications and variations coming within the spirit and scope of the following claims.

We claim:

1. A method for passivating a surface of an integrated circuit comprising the steps of:
   completely fabricating ferroelectric devices in the integrated circuit; and
   depositing a passivation layer over the entire surface of the integrated circuit,
   wherein the passivation layer is comprised of a ceramic material selected from a group consisting of doped and undoped titanates, zirconates, niobates, tantalates, stanates, hafnates, and manganates, and having a Mohs hardness level of seven or greater.

2. The method of claim 1 in which the step of depositing a passivation layer comprises the step of depositing a ferroelectric passivation layer.

3. The method of claim 1 in which the step of depositing a passivation layer comprises the step of RF sputtering the passivation layer.

4. The method of claim 1 further comprising the step of depositing an insulating layer on the surface of the integrated circuit prior to depositing the passivation layer.

5. The method of claim 4 in which the step of depositing an insulating layer comprises the step of depositing a layer of silicon dioxide.

6. The method of claim 5 in which the step of depositing a layer of silicon dioxide comprises the step of reacting TEOS with oxygen in a plasma environment at a temperature of about 400 degrees centigrade.

7. The method of claim 6 further comprising the step of enhancing the reaction of TEOS plasma and oxygen by using a dual frequency chemical vapor deposition chamber.

8. The method of claim 1 further comprising the step of etching the passivation layer above portions of the integrated circuit containing bonding pads.

9. The method of claim 1 further comprising the step of depositing a sealing layer on the surface of the passivation layer.

10. The method of claim 9 in which the step of depositing a sealing layer comprises the step of depositing a material selected from a group consisting of silicon dioxide, silicon nitride, and polymer based materials.

11. The method of claim 1 in which the step of depositing a passivation layer comprises the step of depositing a layer of the same ferroelectric material used to fabricate the ferroelectric devices.

* * * * *